(12) United States Patent
Lee

(10) Patent No.: US 6,323,494 B1
(45) Date of Patent: Nov. 27, 2001

(54) VERTICAL DIRECTION FORCE TRANSDUCER

(75) Inventor: Martin E. Lee, Saratoga, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/289,249

(22) Filed: Apr. 9, 1999

(51) Int. Cl.$^7$ ................. H01J 37/20; F15B 5/00
(52) U.S. Cl. .................. 250/442.11; 137/85
(58) Field of Search ................ 250/442.11; 137/85

(56) References Cited

U.S. PATENT DOCUMENTS

| | | | |
|---|---|---|---|
| 4,524,948 | * 6/1985 | Hall | 251/139 |
| 4,742,286 | 5/1988 | Phillips | 318/640 |
| 4,818,838 | 4/1989 | Young et al. | 219/121.12 |
| 4,908,519 | 3/1990 | Park et al. | 250/306 |
| 5,153,494 | 10/1992 | Hollis, Jr. | 318/640 |
| 5,208,497 | 5/1993 | Ishii et al. | 310/12 |
| 5,323,012 | 6/1994 | Auslander et al. | 250/492.2 |
| 5,407,519 | 4/1995 | Joffe et al. | 156/358 |
| 5,493,488 | * 2/1996 | Castle et al. | 137/85 |
| 5,711,507 | 1/1998 | Berget et al. | 251/129.04 |
| 6,130,490 | * 10/2000 | Lee | 310/12 |

* cited by examiner

*Primary Examiner*—Jack Berman
(74) *Attorney, Agent, or Firm*—Skjerven, Morrill, MacPherson LLP; Norman B. Klivans

(57) ABSTRACT

A transducer includes a pneumatic actuator in combination with a stepper motor lifter mechanism to which is opposed an attractive E-I core actuator for precise vertical positioning of a load with minimal transmission of vibration. A typical application is for vertical positioning of a stage in a lithography machine. The use of a stepper motor driving a lead screw and pneumatic actuator together with an attractive E-I core actuator provides a large dynamic range force actuator. The transducer has a sensor which is located spaced away from the E-I core actuator gap and which operates inductively to measure the gap. A compliant diaphragm for the pneumatic actuation allows the load to move a small amount in all six degrees of freedom.

18 Claims, 3 Drawing Sheets

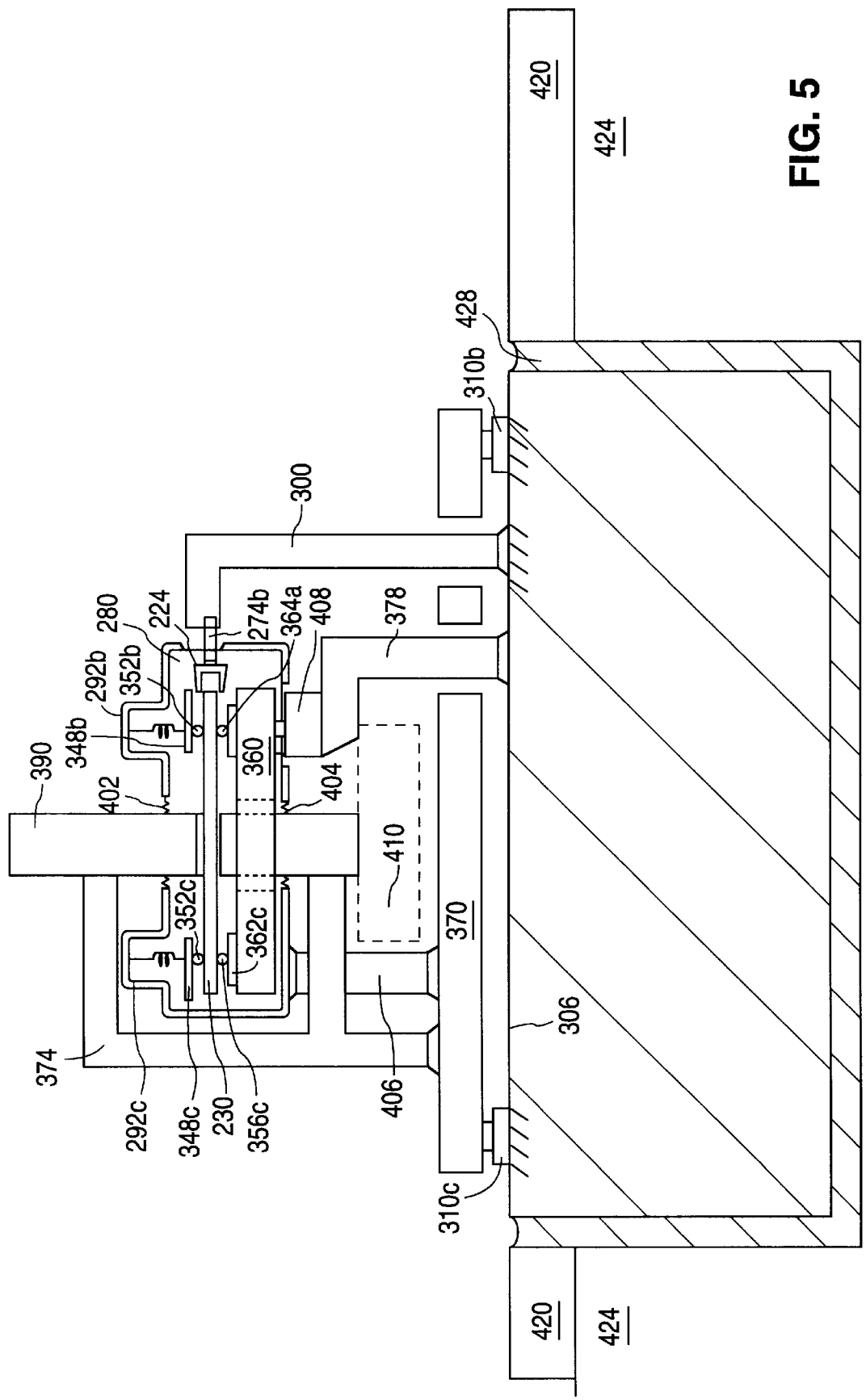

VERTICAL DIRECTION FORCE TRANSDUCER

BACKGROUND

1. Field of the Invention

This invention relates to force transducers (actuators) and more specifically to a force transducer suitable for use e.g. in a lithography machine.

2. Background

In the mechanical engineering field, it is a well known problem to provide precision motion with minimum vibration. For instance such motion is frequently needed in the context of machine tools and lithography, e.g. stepper and scanner machines used in the semiconductor industry. Typically the goal is to provide precision location of, for instance, an x-y stage in three dimensions. (Typically the two horizontal directions are denoted x and y and the vertical direction is designated z.) Such stages are used for instance to position a workpiece such as a wafer or a reticle. An example of a x-y stage is disclosed in U.S. patent application Ser. No. 09/287,545 filed Apr. 6, 1999, commonly invented, entitled "X-Y Stage With Movable Magnet Plate" now U.S. Pat. No. 6,130,490, issued Oct. 10, 2000, incorporated herein by reference. That discloses an x-y stage suitable for supporting a reticle in a lithography system.

The particular x-y stage is supported underneath by ball and flat spherical bearing system with a set of e.g. four relatively large diameter hard spheres supporting the weight of the stage on an underlying support plate. The stage moves in two dimensions (x and y) on the support plate. The spheres are not continuously constrained in a cage in one embodiment, unlike a conventional ball bearing, but instead move relatively freely to the stage on the underlying support plate surface. There are associated bearing support surfaces on the underside of the stage and on the top surface of the underlying support plate for the balls to move upon. These surfaces are specially hardened regions.

In that system, as is typical, some vertical motion (z direction) is used to keep the stage at a particular vertical location, for instance for focusing purposes. This vertical positioning may occur continuously while the system is in operation.

Therefore there is presented the problem of providing an accurate and precise z axis positioning in such a system. In certain such systems it is desirable to avoid transmission of vibration through the z direction positioning since the stage must be kept free of vibration.

SUMMARY

In accordance with this invention, vertical adjustment of a stage used e.g. in a lithographic apparatus is carried out by a force transducer which includes a combination of a pneumatic actuator, a stepper motor lifter, and an opposing electric force actuator.

A stage support plate is movable in the z (vertical) direction under the influence of several such spaced apart force transducers. The force transducers in one embodiment each include a pneumatic (air pressure) device and lifter stepper motor in combination to bear the weight of the stage assembly and support plate, further in combination with an electrical "clapper" (E-I core actuator) to provide a countervailing force, to pull the support plate down against the pneumatic force. The purpose of the lifter is to adjust the gap of the E-I core actuator.

In an E-I core actuator, the E core is typically a structure, for instance of iron, having the shape of a letter E with an insulated electric coil wound around the center bar of the E and a source of current supplying current to the coil. This creates an intense electromagnetic field which attracts the associated I-shaped core which is also formed for instance of iron. Thus an electromagnetic force is exerted across the width of the gap between the E and the I cores. Typically in use the E core is attached to a framework and the I core is attached to another structure which is thereby attracted to the E core. This causes movement of the structure attached to the I core. Such E-I core actuators are well known and commercially available devices.

The present force transducer is especially advantageous in an E beam (electron beam) projection lithography system where there are two parallel image planes used to transfer images. Typically the first image plane is a position where the master or reticle image plane is located. (Note that this is usually an electron beam system which uses a reticle, rather than a direct write electron beam system). The second image plane is a position where the target workpiece (e.g. wafer) is located. The axis of the system is normal to the two image planes and centered about the two images. This reticle carries a pattern that conventionally is to be reproduced on the wafer which is typically covered by a layer of a photoresist. The wafer is positioned at the second image plane.

An application of the present force transducers is to locate the reticle on its stage at a constant position with respect to the electron beam column in the Z direction, that is a constant focus position, while the reticle is being scanned by the electron beam in a plane normal to the column. In accordance with this invention the reaction force of the z direction force transducer does not disturb (vibrate) the electron beam column, nor do vibrations from the base of the force transducer propagate through to the electron beam column. This ensures accurate lithography. Advantageously in accordance with this invention the transfer of vibration from the z direction force transducer base to the actual stage is essentially zero. This is because the E-I core actuator gap can operate as if it has a near zero spring rate from zero frequency to frequencies in the hundreds of Hertz range and the spring rate of the pneumatic actuator can be nullified by the E-I core actuator force controller.

The present transducer can be used to position the stage which is located in a vacuum (needed in an electron beam lithography) while most of the z direction force actuator mechanism is located outside the vacuum. This leaves most of the moving parts and all the control electronics outside of the vacuum, which improves maintenance access and minimizes possibility of vacuum contamination.

Since in accordance with one embodiment of the invention the constant lifting force is provided pneumatically, the needed magnetic control force for the E-I core actuator is reduced to what is needed only for high frequency trimming (adjustment) purposes and pneumatic force errors. This reduces the power requirements for the magnetic transducer, thereby reducing heat generation and may also reduce magnetic shielding requirements.

The stepper motor (part of the lifter assembly) is used, in one embodiment, only to initially adjust the gap in the E-I core actuator to its design operating offset. Thus the only remaining wear item is the pneumatic diaphragm in the pneumatic actuator.

Thus in accordance with this invention the use of two motion control devices, which are the stepper motor lifter (with its associated lead screw drive) and the pneumatic lift, in concert with the opposing E-I core actuator provide a large dynamic range force transducer. The stepper motor (mechanical) lift and the pneumatic lift are in effect subservient to the E-I core actuator, to maintain the E-I core actuator gap so it is a force transducer. In one embodiment the E-I core actuator has a gap sensor which includes a sensor target mounted on a nonmagnetic shaft which is located passing through the center of the E-I core actuator device. This allows the effective gap size to be sensed even when there is a "wedge" (non-parallel gap) present. Since there can be a small tilt of the base mount of the E-I core actuator relative to the reticle stage, the actual gap is sensed in the center of the E-I core and not the edge where it would take two sensors to find the average gap.

Thus the force transducer has a near zero spring constant that provides constant force independent of changes in the gap size. This advantageously prevents vibrations from being transmitted through the force transducer.

Also, there is a possibility of providing acoustic pressure cancellation by adding a bellows at the gap sensor and providing a vacuum inside the bellows. The pneumatic actuator includes in one embodiment a compliant pneumatic diaphragm which allows the stage plate to move a small amount in all six degrees of freedom rather than merely vertically. The pneumatic actuator includes in one embodiment a pneumatic cavity which is formed as an integral part of the pneumatic lift assembly instead of being for instance a discrete part connected by a hose or tube. This integration of the pneumatic cavity increases high frequency compliance. Also in one embodiment, a single motor connected to three lifter lead screw assemblies can be used to adjust the E-I core actuator gap to its design set point.

It is to be understood that the present invention is not limited to electron beam reticle projection systems nor to electron beam systems but is instead a general precision location mechanism.

BRIEF DESCRIPTION OF THE DRAWINGS

FIG. 5 shows use of the FIG. 1 structure in a lithographic apparatus.

DETAILED DESCRIPTION

Figure 1:
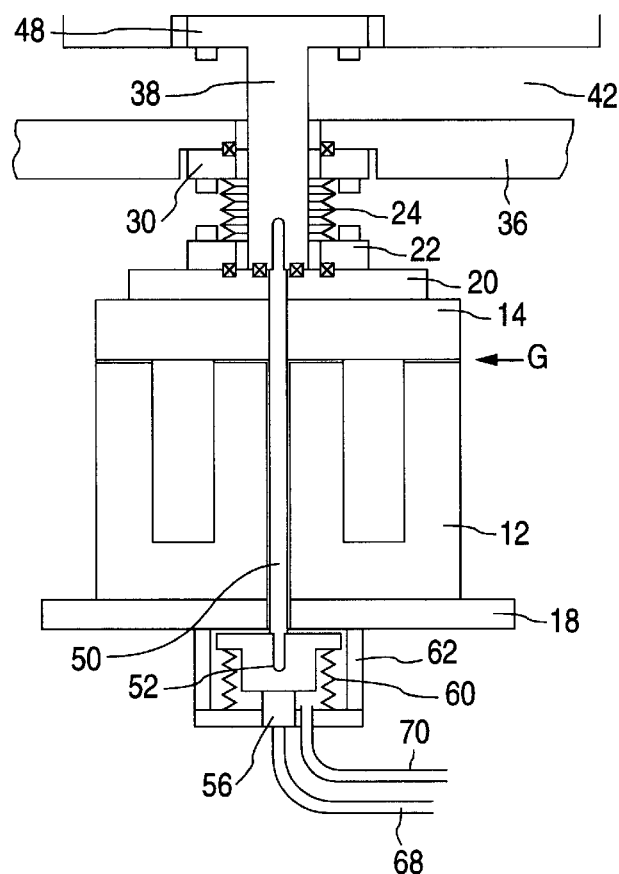
FIG. 1 shows a front view of a single z direction force transducer in accordance with this invention.

The present force transducer uses an E-I core type clapper actuator (typically a commercial available component) as a programmable force transducer. The transducer's force remains constant for small motions or vibrations which emanate from its base or from the element, for instance the stage z support plate, being positioned by the actuator. The E-I core actuator has an associated electrical gap sensor and electronics which, in a feedback loop, cause the force to be independent of the gap distance (size) of the E-I core. In one example the gap is in the range of 0.02 inches to 0.08 inches with a nominal gap of 0.05 inches.

As explained above, in one embodiment an x-y stage is positioned by three such transducers and weighs in one example 160 pounds. The associated stage z support plate (which supports the stage on the spherical bearings) weighs 75 pounds. In one embodiment (see above-referenced patent application) an additional downward force of 400 pounds is exerted down on the stage by vertically acting loaders. This provides a total force to be supported of 635 pounds. A portion of this is the pure force of the preloaders of 400 pounds and the remainder is the gravitational force exerted by the mass of the stage and stage plate of 235 pounds.

When the transducer supports a mass it uses its pneumatic actuator. When the force is to be changed, first the control electronics immediately change the force supplied by the E-I core actuator. Then at a very low response rate, the control electronics change the pneumatic force to bring the E-I core actuator's force back to its nominal setting. Therefore in the feedback loop (including the E-I core gap sensor), the sensed gap size determines the amount of current sourced to the E-I core actuator to maintain a constant force. If the amount of force to be exerted by the E-I core actuator changes (due, e.g., to an external command) the feedback loop adjusts the current sourced to the E-I core actuator accordingly. So, it is the task of the E-I core actuator to perform all force changes, and the task of the pneumatic actuator is (as fast as it can) to maintain the average force on the E-I core actuator at its nominal setting (in one case the nominal setting is about 40 pounds force).

Assume for example the z direction force transducer is to provide 0.5 g acceleration. If there are for example three such z direction force transducers equally loaded, each one must exert 235 divide by three times two or 39.2 pounds force. (In another example this is not the case because the stage system is oriented such that two of the z direction force transducers are located directly under two of the preloaders and the third transducer carries the load of half the system rather than merely one-third. However one may assume that a particular force transducer can be scaled up in terms of its force exerted at least by a factor of two.) It is to be understood that the specifications given here are merely exemplary for purposes of illustrating system configuration and are not limiting in any way.

FIG. 1 illustrates a front view of a single z direction force transducer in accordance with this invention. This is a somewhat schematic view in that the parts are not shown in full detail but merely illustrated sufficiently for purposes of understanding. The individual components are generally conventional and their dimensions and materials are generally not critical but would be what is required as understood by one of ordinary skill in the art, depending on the system constraints.

This transducer includes two main assemblies, the first of which includes the E-core supported on its base and the second of which includes the cooperating I-core which supports the stage. The pneumatic actuator pushes up on the second assembly, against the direction of the E-I core attraction. The mechanical lifter pushes the (lower) first assembly (with the Ecore) up relative to the foundation (ground).

The central portion of this transducer (see FIG. 1) is the E core 12 with its associated cooperating I core 14. (These structures are so called because of their characteristic shape.) Gap G is present between the E core and the I core. Such devices are attractive electromagnetic devices. A current is supplied to a winding (not shown in FIG. 1) which is wrapped around the central crossbar of the E core 12. This creates an electromagnetic field which attracts the ferromagnetic I core 14. The amount of attraction, that is the force exerted, is dependent upon the amount of current supplied to the winding. The amount of this current of course can be varied to provide variable amounts of force. The E core 12 rests on a base 18 to which it is fixedly mounted.

When the transducer is operating in concert with two or more other such transducers, and all of these transducers are moving a single platform for the positioning of a stage, there will normally be some tilt ("wedge") between the base of these transducers and the reticle stage. This tilt shows up in two places on the transducers. It appears across the pneumatic diaphragm, which presents no problem since the diaphragm is compliant and it is the nature of a diaphragm to allow this. It also appears across the gap between the E core and I core. This is also not problematic to the function of the E-I core actuator, but the control electronics needs to receive a signal indicating the average gap size at the E-T core actuator. This average gap size could be measured at several positions at the periphery of the E-I core actuator, then an average of the peripheral sensors' readings would give the average gap dimension. Another way to find this average is to measure once at the center of the E-I core actuator, as illustrated here.

In the FIG. 1 structure the top plate 20 is fixedly attached to the I core 14. A bellows base 22 is firmly attached, for instance by bolts, to the top plate 20. A bellows 24 extends from the bellows base 22 up to an upper bellows base 30 which is fixedly attached to the vacuum system wall 36. This attachment is for instance by bolts as shown. The bellows 24 is for instance a stainless steel bellows which confines a vacuum inside it. A vertical member 38 extends from the top plate 20 up through the vacuum wall 36 through the vacuum space 42 and terminates in an upper plate 48.

The (unlabelled) structure immediately above space 42 is the lower surface of the z axis support plate on which is located the stage bearing pads (see below.) Thus everything in FIG. 1 above the wall 36 is in the vacuum. The plate above space 42 thus actually supports the stage, through for instance a spherical bearing system. Typically, this plate which actually supports the stage via the intervening spherical balls, includes flexures which hold the plate constant in the x, y and theta (rotational) directions while allowing the plate to move in the z direction at the three points determined by the three transducers.

Figure 2:
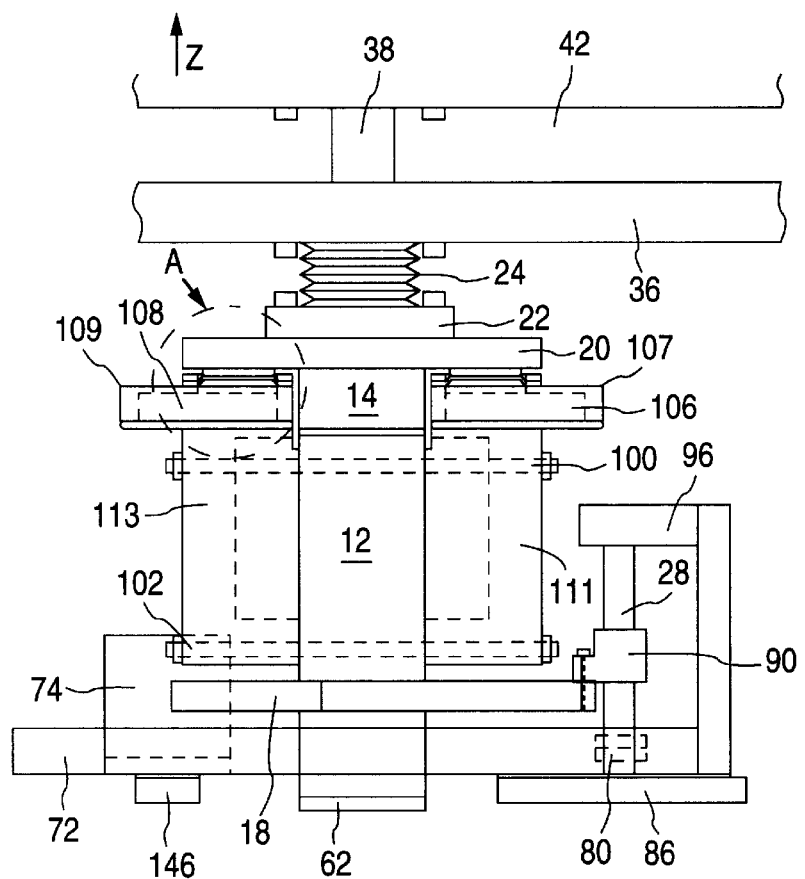
FIG. 2 shows a side view of the structure of FIG. 1 showing additional elements including some internal elements.

Extending down from member 38 through the I core 14 and E core 12 is a nonmagnetic connecting rod 50. This rod is of nonmagnetic material so that the influence of the E-I core actuator does not affect it. The bottom portion of this rod 50 is a sensor target 52 which interacts with an induction sensor 56 to determine the amount of the E-I core gap G. The bottom portion of the rod 50 is inside a bellows 60 which confines inside it a vacuum. A housing 62 is provided around the bellows. Electrical leads 68 connect to the sensor 56. A vacuum tube 70 allows evacuation of the interior of the bellows 60. Rod 50 is rigidly attached to the I core 14 and therefore it moves up and down relative to the E core 12 and the sensor 56 as the E-I core actuator moves. (The region immediately laterally surrounding rod 50 where it passes through the E-core 12 is at atmospheric pressure.) FIG. 2 is a side view showing some of the same structures as in FIG. 1 and some additional structures as well as part of the internal structure. Shown in FIG. 2 is a part of the support structure for the actuator of FIG. 1 including a base plate 72 on which is mounted a stepper motor 74. (This base plate 72 is the base for the entire transducer of FIG. 1 and 2.) Also shown in FIG. 2 is a lifter assembly to the right-hand side of the drawing for lifting the E-core and its base 18 relative to the transducer base plate 72 in the vertical (z axis) direction.

This lifter assembly includes, in addition to the stepper motor 74, associated lead screw 78 and associated nut 90 and a lifter pulley 86 driven by stepper motor 74. The outer race of ball bearings 80 is fixed to plate 72 and the inner race of ball bearings 80 is fixed to lead screw 78. Member 96 supports the upper end of lead screw 78. Note that while FIG. 2 only shows one lifter assembly (for clarity), preferably there are three lifter assemblies associated with each E-I core actuator. A timing belt is provided, as described below, to coordinate motion in the vertical direction of the three lifters driven by a single stepper motor 74.

Figure 3:
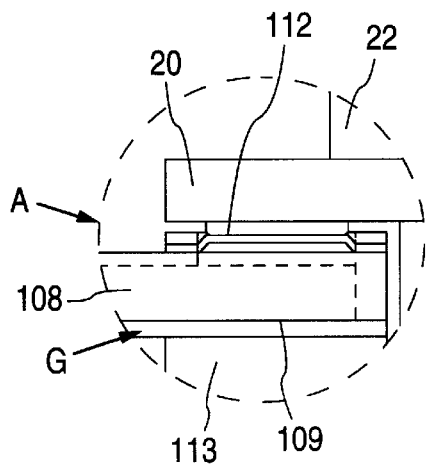
FIG. 3 shows detail of a portion of the FIG. 2 structure.

The upper portion of this structure includes the pneumatic actuator, a portion of which is labeled as detail A and shown in an enlarged view in FIG. 3. FIG. 2 shows the cavities 106, 108 formed in respectively members 107, 109. Members 107, 109 are supported by vertical supports 111, 113. For purposes of holding the structure together, horizontal support members (e.g. bolts) 100 and 102 extend horizontally. Cavities 106, 108 are for pneumatic actuation purposes. Bordering on the cavity 108 (shown in detail in FIG. 3) is a compliant diaphragm 112 against which the pneumatic force operates. The pneumatic pressure is conventionally provided via tubing (not shown).

With reference to the above example, in terms of forces the load (in pounds force) from the stage system on this z direction transducer is 170 pounds of which 100 pounds is provided from the preloading. The pneumatic assist will carry a 240 pound load which leaves a load (in the opposite direction) of 70 pounds force for the E-I core actuator to exert. Note that the force exerted by the E-I core actuator is in the opposite direction from that exerted by the pneumatic actuator. Since the E-I actuator core can only provide a pulling force, this offset of 70 pounds force lets the E-I core actuator range from 0 pounds force to 140 pounds force or effectively ± one G (±70 pounds force). As the load (which is the stage) moves from position to position in the x and y axes, the 70 pounds force load varies and reduces or increases the available bilateral force available to the E-I core actuator.

The spring constant for the pneumatic actuator is 50 pounds per inch. The actuator is provided by two diaphragms each of one of which is one square inch of surface area. One such diaphragm 112 is shown in FIG. 3, and the other is associated with cavity 106 shown in FIG. 2. Each diaphragm has a cavity of five cubic inches volume located below it. The diaphragms push up on the I core of the E-I actuator core in the direction to increase the gap width due to the provision of air pressure in the cavities.

The transducer base plate 72 is typically attached to a framework which in turn is attached to the entire machine's base plate.

The base 18 of the E-I core actuator is attached to the transducer base plate 72 and is adjustable relative thereto in the z axis by, for instance, ±0.25 inches. This adjustment provided by the stepper motor 74 and associated lifter mechanism sets the E-I core actuator gap G at its nominal 0.05 inch width while the transducer is being used to hold the stage at the proper distance from, for instance, the lens section of the electron beam column (or other critical dimension).

Typically this adjustment of the stepper motor and the lifter is performed only once, during set up of the machine, because the available gap G in the E-I core actuator should be sufficient to accommodate any small changes in the system operation. (Of course the adjustment may be performed more often.)

Typically the pneumatic actuator would be used to hold the nominal 70 pounds force load against the force exerted by the E-I core actuator. The pneumatic actuator would operate for instance at a bandwidth of less than 2 Hz whereas the E-I core actuator operates for instance in the 0 to 200 Hz range.

The bellows 24 seals the vacuum chamber defined by wall 36 from atmospheric pressure. Of course the vacuum is not a necessary aspect in accordance with this invention but is typically required in the electron beam application. The bellows 60 located below the E core is connected to a vacuum pump by tubing 70 as shown and serves to cancel the effect of atmospheric pressure changes (acoustic noise) which would modify the force applied at the I bellows 24.

The connecting rod 50 serves two purposes. First, it connects the force of the atmospheric pressure between the two bellows 24 and 60 for force cancellation and acoustic noise cancellation. FIG. 1 shows two sets of bellows. Bellows 24 is connected to the main vacuum chamber. The lower bellows 60 is connected to the transducer's base. If the pressure in the room was to suddenly increase, by a door of the room which houses the system shutting for instance, and only the upper bellows 24 was connected to the vacuum chamber, then the increase in pressure would tend to compress bellows 24. This compression force is added to the force of the transducer as an error, and would raise the stage. With the lower bellows 60 attached to the base, this pressure increase tends to compress it the same amount as the upper bellows 24 but in the opposite direction. This cancels the effect of the pressure change.

Also, rod 50 interacts with the associated inductive position sensor 56. That is, the end of rod 50 near sensor 56 is an inductive sensor target. This allows use of an inductive (or alternately capacitive) sensor to measure the E-I core actuator gap G. Typically an inductive sensor will not work well at the actual location of the gap G because of the large varying magnetic fields present there. Hence in this case the gap G is measured remotely using the end of rod 50. Also it is best to measure the gap G at the center of its area since this tends to cancel gap "wedge" errors and allows use of a single sensor. Further, there typically is not enough space at gap G to allow location of the sensor there.

A conventional servo control circuit (not shown) is provided for this transducer. The control circuit has two types of input signals. The first type of input signal is a constant three position sensor input giving the z support plate 42 position relative to the electron beam column lens section. (It is to be understood that the electron beam column lens section is the controlling point.) The second type of input signal is intermittent and measures three positions around the active image where available, for instance during exposure and during initialization, in a lithography application. The first type of input signal is always available so there is no loss of servo input when the reticle image is unavailable.

The pneumatic actuators are each controlled using e.g. a Fairchild model T7800 Electro-Pneumatic transducer in combination with the Fairchild model 4500 volume booster. Use of these parts is well understood by one of ordinary skill in this field. These Fairchild transducers have as an internal component a non-vibrating piezoelectric diaphragm. This minimizes acoustical noise generated by operation of the Fairchild transducers. An example of the inductive position sensor 56 is the Kaman KD-2310-25 sensor. Of course these particular parts are not limiting.

Figure 4:
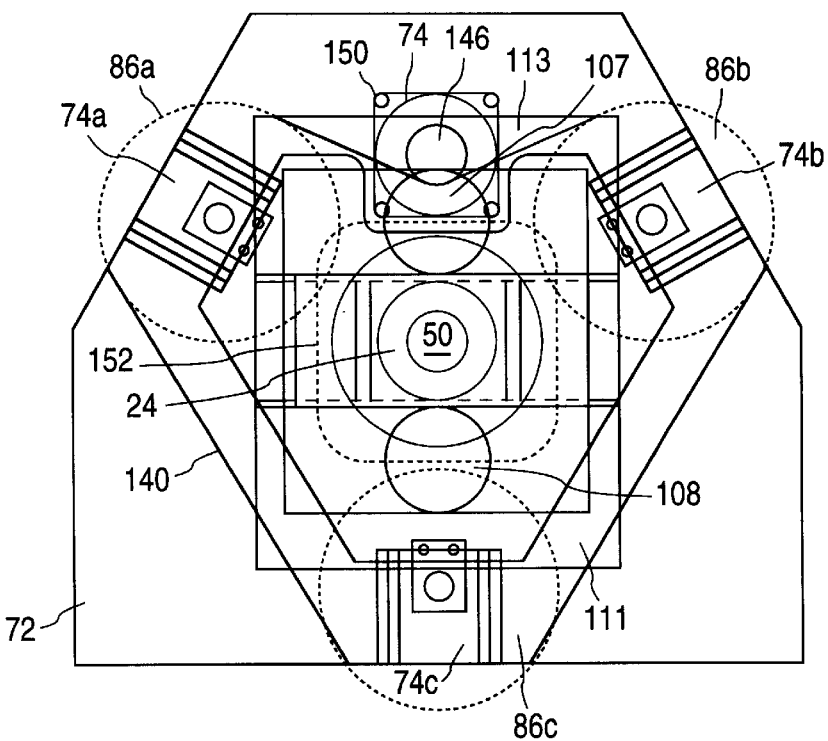
FIG. 4 shows a plan view of the FIG. 2 structure.

FIG. 4 is a plan view including the FIG. 2 structure and other elements. Some of the elements shown in FIG. 4 correspond to those shown in FIGS. 1, 2 and 3. Shown in FIG. 4 (and not shown in the other figures) is an outline of the E-core winding 152. While FIG. 2 shows only one lifter, FIG. 4 shows that there are actually three such lifters 74a, 74b and 74c each with its associated lead screw mechanism of the type shown in FIG. 2. Each lifter has an associated respective pulley 86a, 86b, and 86c all connected by timing belt 140. A driver 146 (also seen in FIG. 2) driven by stepper motor 74 mounted on a base 150 drives the timing belt 140 so that all three lifters move vertically in a coordinated fashion.

FIG. 5 illustrates a lithographic apparatus in which the present vertical direction force transducer may be used. This drawing is similar to one in the above-mentioned application "X-Y Stage With Movable Magnet Plate". FIG. 5 is a side view of such an apparatus and does not show the elements in any particular detail. A stage 230 is supported on a Z direction (vertical) axis support plate 360 with several ball and flat bearings, one of which includes the ball 356c which rides on a flat 362c which is a part of the support plate 360. There are also two other such ball and flat structures for supporting the support plate 230 from underneath (not visible). A downwards pressure (load) is exerted on the stage 230 via several similar ball and flat bearings including ball 352c with associated preload flat plate 348c. Another such ball and flat combination exerting the preload includes ball 352b and associated plate 348b. A spring pushes downwards on the plates 348c and 348b. It is to be understood that typically there are two (or more) other similar ball and flat structures for exerting the preload not visible).

The stage 230 includes a bearing pad 364a which is similar to pad 362a in terms of material and size. Similar pads are provided for each of the other balls but not shown. Housings 292b and 292c are provided for the preload structure. The electron beam column housing 390 is shown extending through a bellows structure 402 which is part of the vacuum enclosure 80. The lower corresponding bellows 404 seals the vacuum enclosure 280 against the lower portion of the electron beam column 390.

Also shown is magnet plate 224 which is part of the structure for moving the stage 230 and the associated horizontal support post 274b (of which several are actually present). The stage 230 moves in and out of the plane of the drawing under the influence of linear motors and magnet plate 224 supports tracks of one set of such linear motors.

Resting on vertical isolation pads 310c, 310b is the upper "seismic" plate 370 which is a large heavy plate and through which penetrate (without touching) the vertical reaction force support structures of which only 300 is shown. Structure 300 holds the support posts such as support post 274b Resting on the seismic plate 370 is the electron beam column support structure 374 which is both a horizontal and vertical structure with a central collar for holding the electron beam column 390.

A reticle stage vacuum enclosure support 406 extends down to the seismic plate 370 and is rigidly attached thereto. Of course typically there would be three or four such support structures for the reticle stage enclosure, but only one is illustrated. The lower portion of the electron beam column 390 extends down to a wafer stage enclosure 410 which is not shown in any detail herein and rests on seismic plate 370. Typically, enclosure 410 houses an X-Y stage for supporting and moving the workpiece (wafer). It is to be appreciated that the upper stage 230 typically supports and moves a reticle (mask).

Underlying the foundation plate 306 is the actual foundation, for instance of concrete, located in a large cavity dug through the factory floor 420 and is (in three-dimensions) isolated therefrom by a compliant material layer 428, for instance rubber. The underlying dirt 424 (the earth) is also shown for purposes of understanding.

The element of most interest in accordance with this invention is structure 408, not shown in FIG. 5 in any detail, which is a vertical direction force transducer described above, the purpose of which is to move plate 360 in the vertical direction. Typically, as described above, three such structures 408 are provided but only one is shown for simplicity of understanding in this illustration. These structures 408 in turn are supported on supports such as 378 which penetrate through seismic plate 370 to rest on foundation plate 306.

Of course, many other types of lithographic apparatus are well-known and the present transducer is adapted for use with a number of such structures especially those in which, as shown here, the actual stage is housed in a vacuum.

This description is illustrative and not limiting; further modifications will be apparent to those skilled in the art in light of this disclosure and are intended to fall within the scope of the appended claims.

I claim:

1. A force transducer apparatus comprising:
   a first assembly including a first element of an attractive electromagnetic actuator;
   a second assembly including a second element of the electromagnetic actuator which cooperates with the first element and is located adjacent the first element; and
   a pneumatic actuator associated with the second assembly and which pushes the second assembly away from the first assembly.

2. The apparatus of claim 1, wherein the first element is one of an E core or an I core and the second element is the other of the E core or the I core.

3. The apparatus of claim 1, further comprising a lifter coupled to the first assembly and which moves the first assembly relative to the ground.

4. The apparatus of claim 3, wherein the lifter includes a stepper motor.

5. The apparatus of claim 1, wherein the pneumatic actuator includes a compliant diaphragm.

6. The apparatus of claim 1, wherein the pneumatic actuator includes a cavity defined in the second assembly for accommodating pneumatic fluid.

7. The apparatus of claim 1 further comprising a member extending through both the first and second elements, the member being of a non-magnetic material and one end of the member cooperating with a sensor to determine a gap between the first and second elements.

8. The apparatus of claim 7, further comprising a first bellows coaxial to a first end of the member and a second bellows coaxial to a second end of the member, a region extending from the first to the second bellows being at least a partial vacuum.

9. The apparatus of claim 3, further comprising at least one additional lifter coupled to the first assembly and spaced apart from the first lifter and coupled to the first lifter by a drive element.

10. The apparatus of claim 9, wherein the drive element is driven by a stepper motor coupled thereto.

11. The apparatus of claim 1, wherein the second assembly is isolated from vibrations in the first assembly.

12. The apparatus of claim 7, wherein a current supplied to the electro-magnetic actuator is responsive to an amount of the gap determined by the sensor, thereby maintaining a constant force exerted by the electromagnetic actuator independent of its position.

13. The apparatus of claim 1, wherein the first assembly includes a base on which the first element is mounted.

14. A lithographic apparatus comprising:
    a source of a beam;
    a stage carrying an object to be irradiated by the beam;
    a first assembly including a first element of an attractive electromagnetic actuator;
    a second assembly including a second element of the electromagnetic actuator which cooperates with the first element and is located adjacent the first element; and
    a pneumatic actuator associated with the second assembly and which pushes the second assembly away from the first assembly;
    wherein the stage is supported by the second assembly.

15. A method for dynamically positioning an object, comprising the acts of:
    pneumatically pushing the object in a first direction;
    pulling the object in an opposite direction at the same time by an electromagnetic actuator defining a gap; and
    adjusting a nominal size of the gap mechanically.

16. The method of claim 15, wherein the amount of electromagnetic attraction is a function of an amount of current sourced to the electromagnetic actuator, and further comprising the act of adjusting the amount of the current.

17. The method of claim 15, further comprising the acts of:
    sensing a position of the object; and
    altering an amount of pulling by the electromagnetic actuator in response to the sensed position.

18. The method of claim 15, wherein the pulling is such as to isolate the object from external vibrations.

* * * * *